(12) United States Patent
Lunghofer et al.

(10) Patent No.: US 6,344,747 B1
(45) Date of Patent: Feb. 5, 2002

(54) DEVICE AND METHOD FOR MONITORING THE CONDITION OF A THERMOCOUPLE

(75) Inventors: James G. Lunghofer, Colorado Springs, CO (US); Collins P. Cannon, Kearney, MO (US); Trevor Pugh, Magnolia, TX (US); Randy Riggs, Montgomery, TX (US); M. David Landrum, Conroe, TX (US)

(73) Assignee: Accutru International, Kingwood, TX (US)

( * ) Notice: Subject to any disclaimer, the term of this patent is extended or adjusted under 35 U.S.C. 154(b) by 0 days.

(21) Appl. No.: 09/394,611

(22) Filed: Sep. 13, 1999

Related U.S. Application Data

(63) Continuation of application No. 09/261,696, filed on Mar. 11, 1999, now abandoned.

(51) Int. Cl.[7] .............................................. G01R 31/02
(52) U.S. Cl. ...................................... 324/537; 324/549
(58) Field of Search .............................. 324/537, 691, 324/718, 433, 549, 555

(56) References Cited

U.S. PATENT DOCUMENTS 5,437,745 A * 8/1995 Frank et al. ................. 148/435
5,499,023 A * 3/1996 Goldschmidt ........... 324/691 X
5,876,122 A * 3/1999 Eryurek ................... 324/541 X

* cited by examiner

Primary Examiner—Safet Metjahic
Assistant Examiner—T. R. Sundaram

(57) ABSTRACT

A device and method for monitoring the condition of a thermocouple. In a preferred embodiment the device comprises a pair of thermocouples, each thermocouple comprising first and second thermoelement wires, and a diagnostic element selectively electrically coupled at a junction with one of the thermoelements. In a preferred embodiment, the diagnostic element is selected such that it is more stable at the expected operating temperature range of the thermocouple than the thermoelement wires themselves are. The diagnostic element can be switched into electrical connection with any of the thermoelements forming the thermocouples to thereby define one or more loops. An initial loop resistance is measured and recorded around each of the thermoelement/diagnostic element loops. This initial resistance is stored in a calibration matrix as a reference value. The initial loop resistance may be taken as part of a calibration process or during initial operation of the thermocouple. Subsequent loop resistance measurements are then taken over time as the thermocouples age and compared against the reference value. By comparing the reference value to subsequent measurements, the level of degradation of the thermoelements can be monitored. Further, in an embodiment utilizing an electrically conductive sheath material, a conductive sheath wire may be used to connect the sheath to any one of the thermoelements or the diagnostic element. By monitoring the resistance in a measurement circuit formed thereby, potential or actual virtual junction error in the thermocouple assembly may be detected.

24 Claims, 9 Drawing Sheets

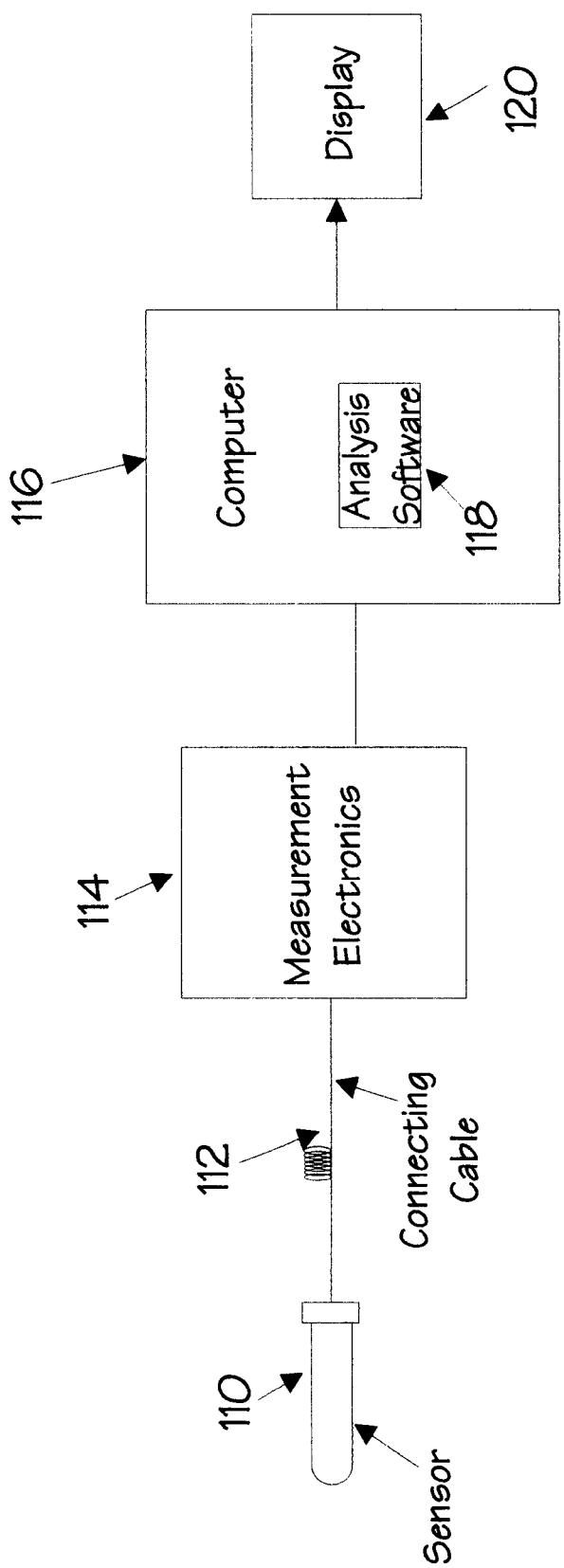

DEVICE AND METHOD FOR MONITORING THE CONDITION OF A THERMOCOUPLE

This application is a continuation of Ser. No. 09/261,696 filed Mar. 11, 1999 now abandoned.

TECHNICAL FIELD

The present invention relates to temperature measurement and, more particularly, to a device and method for monitoring the condition of a thermocouple.

BACKGROUND

Thermocouples are a type of temperature sensor used in a wide variety of applications. Customarily, a thermocouple is comprised of two dissimilar elements, referred to as thermoelements, which are joined at a bimetal junction. The principle on which a thermocouple operates is that a voltage or electromotive force ("EMF") is created at the bimetal junction of the two dissimilar elements. The bimetal junction voltage corresponds to a temperature.

Over time, thermoelements may suffer changes in composition due to operational stresses. Such changes may result in the thermocouple not providing a true temperature. Compositional changes are referred to generally by the term degradation. Degradation can result in the thermoelement providing inaccurate temperature measurements.

When a thermoelement has suffered degradation, an operator of a temperature-dependent process may be able to recognize that degradation has occurred because the operator may intuitively know that the temperature reading being supplied by the thermoelement is outside the normal range of temperatures at which the process operates. However, in some instances, the operator may not be able to recognize that a thermoelement has degraded. Further, an operator is generally unable to recognize the initial stages of degradation in a thermoelement. In such a situation, a temperature-dependent process may still be within an acceptable range of operating temperatures, but not at an optimum operating temperature, or the process may be operating outside an acceptable range of operating temperatures.

SUMMARY

The present invention is directed to a device and method for monitoring one or more thermoelements in a thermocouple, enabling evaluation of the condition of the thermoelements while the thermocouple is in operation. The device and method, in some embodiments, is capable of detecting the initial stages of degradation of one or more thermoelements in a thermocouple.

In one embodiment, a thermocouple consisting of two or more thermoelements joined at a common junction point has a like number of diagnostic elements connected to the common junction point. In an alternative embodiment, the thermocouple has a single diagnostic element selectively coupled with one of the thermoelements of the thermocouple. In either embodiment, when connected with the thermoelement, the diagnostic element and thermoelement form a measurement loop around which a resistance or impedance measurement can be made.

In selecting a diagnostic element one consideration is that the diagnostic element be relatively more stable, i.e., less prone to undergo a change in resistance as a result of operational stresses, than the thermoelement or thermoelements with which the diagnostic element is being paired. However, it is to be understood that a diagnostic element which is less stable than the thermoelement or thermoelements with which it is being paired may also be used in the present invention. In operation, an initial loop resistance is measured and established as a reference or baseline. The loop is then monitored while the thermocouple is in operation for changes in loop resistance. Normally, changes in the loop resistance are an accurate indicator of thermoelement degradation. In the various embodiments, the thermoelement/diagnostic element loops are coupled to measurement electronics. The measurement electronics periodically measure the resistance or impedance of each of the various thermoelement/diagnostic element loops for changes in the loop resistance or impedance at a given temperature.

The present invention is capable of offering one or more advantages. For example, a device in accordance with an embodiment of the present invention can be configured to allow an operator to monitor the thermoelements of a thermocouple sensor assembly for changes in resistance which are indicative of thermoelement degradation. A further advantage of the present invention is that a device in accordance with an embodiment of the present invention allows the thermoelements to be monitored while the sensor is in operation. Also, a device in accordance with an embodiment of the present invention can quantify the degree of degradation which has occurred in the various thermoelements comprising the thermocouple sensor assembly.

Other features and advantages of the invention are apparent from the following detailed description of the invention and the claims.

DESCRIPTION OF THE DRAWINGS

FIG. 1 is a functional block diagram of a device for monitoring a thermoelement in accordance with an embodiment of the present invention;

DETAILED DESCRIPTION

Figure 2A:
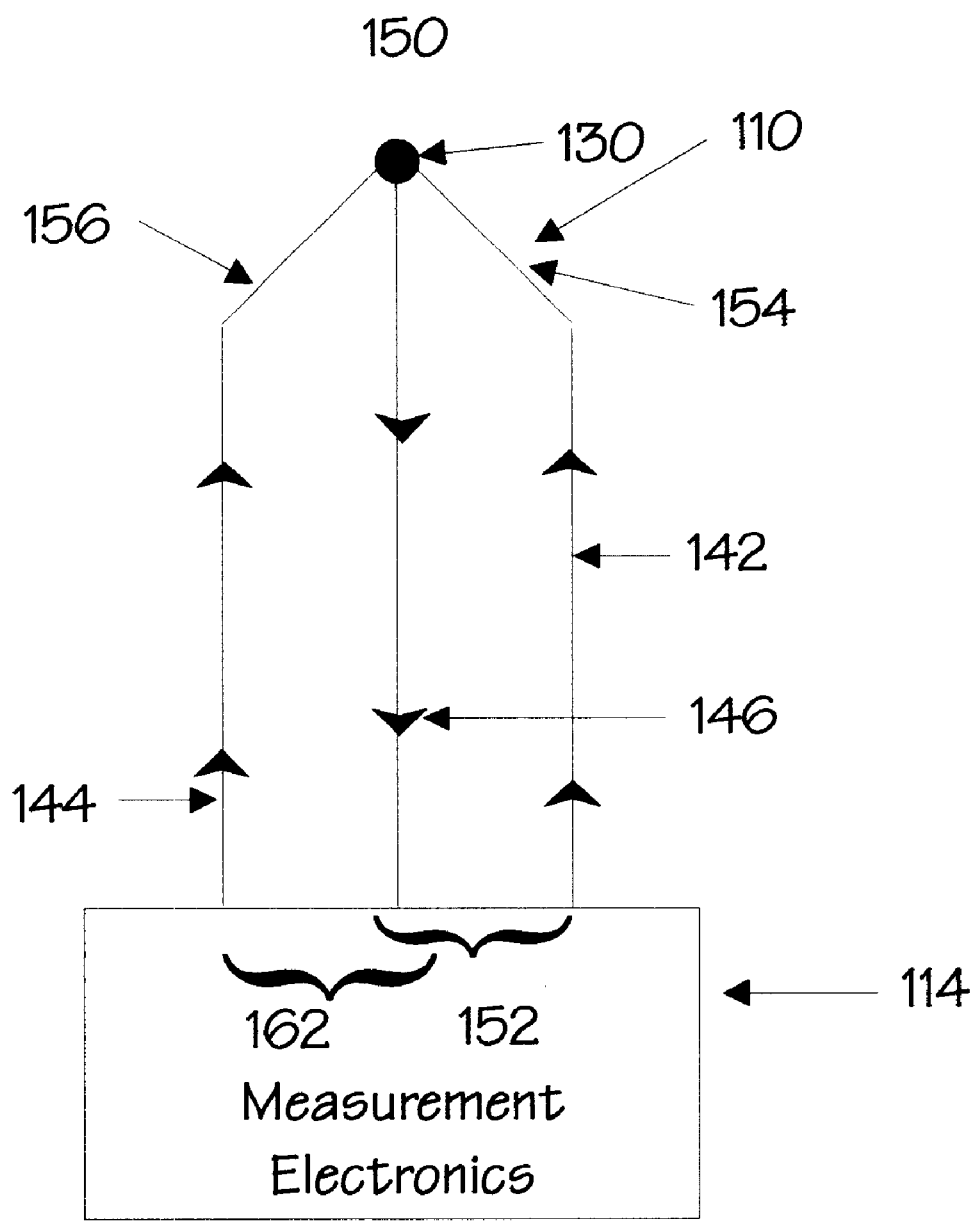
FIG. 2A is a diagram of a sensor incorporating a thermoelement in accordance with one embodiment of the present invention.

FIG. 1 is a functional block diagram of a device 100 for monitoring a thermocouple in accordance with the present invention. As shown in FIG. 1, device 100 may include a sensor 110 coupled via a connecting cable 112 to measurement electronics 114. Sensor 110 may comprise two or more thermoelements and at least one diagnostic element. The thermoelements may form a thermocouple. Measurement electronics 114 can be coupled to a computer 116 that executes software 118 and outputs data on display 120. The output data may include a degradation indicator if a thermoelement in the sensor 110 has suffered a specified level of degradation, or any of a variety of other information related to the degree of degradation, if any, suffered by any of the thermoelements forming sensor 110. The output data may also include the thermodynamic temperature of a system measured by sensor 110.

FIG. 2A is a diagram of a sensor incorporating thermoelements in accordance with one embodiment of the present invention. As shown in FIG. 2A, sensor 110 may include a first thermoelement 142 and a second thermoelement 144 that form a thermocouple 150. Sensor 110 may further include a diagnostic element 146. In the example of FIG. 2A, thermoelements 142, 144 form a two wire thermocouple 150. As an example, thermocouple 150 could be a "type K" thermocouple. Diagnostic element 146 can be realized by a nichrome alloy material. First thermoelement 142 and second thermoelement 144 are joined at junction point 130. Junction point 130 may also be referred to as a weld junction.

As further shown in FIG. 2A, diagnostic element 146 is connected with thermoelement 142. Thermoelement 142 and diagnostic element 146 are joined on one end at weld junction 130 and at the opposite end to thermoelement bridge circuit 152 which joins diagnostic element 146 and thermoelement 142, thereby forming loop 154. Thermoelement 144 is joined with diagnostic element 146 at weld junction 130. Thermoelement 144 and diagnostic element 146 are joined at the opposite end by thermoelement bridge circuit 162 which, in a similar fashion as bridge circuit 152, joins diagnostic element 146 and thermoelement 144 thereby completing loop 156. Thermoelement bridge circuits 152 and 162 are well known in the art. In various embodiments, thermoelement bridge circuits 152 and 162 may be included within measurement electronics 114, e.g., in the form of multiplexer circuitry that selectively connects thermoelements 142, 144 and diagnostic element 146 together in loops.

The selection of the materials from which thermoelements 142 and 144 are constructed, as well as the length and diameter of such elements, will be dependent on the measurement application and system parameters. A primary consideration in selecting any thermocouple is the temperature of the environment in which the thermocouple will be used. As an example, in the embodiment of FIG. 2A, the thermocouple could be a "type K" thermocouple. Type K thermocouples can generally be utilized in operating environments ranging from approximately −200 degrees Celsius to +1250 degrees Celsius. The positive leg of thermocouple 150 is thermoelement 142 which can be manufactured from the material CHROMEL P. The negative leg of thermocouple 150 is thermoelement 144 which can be manufactured from the material ALUMEL. CHROMEL P and ALUMEL are trademarks of Hoskins Manufacturing Company, Hamburg, Michigan. However, the composition of thermoelements 142 and 144 may vary. By way of illustration, platinum, platinum/rhodium, tungsten, tungsten/rhenium, copper, iron, and constantan thermoelements, are all well known in the art and may be substituted for the materials described above. Various combinations of thermoelements and diagnostic elements which may be utilized to form sensor 110 will be discussed in greater detail following a detailed description of certain embodiments.

With further reference to FIG. 2A, the combination of diagnostic element 146 connected with either thermoelement 142 or 144 forms two measurement loops 154 and 156. Measurement loops 154 and 156 may also be referred to as degradation check loops. Measurement loop 154 includes thermoelement 142 and diagnostic element 146, whereas measurement loop 156 includes thermoelement 144 and diagnostic element 146. Measurement electronics 114 may be capable of selectively switching diagnostic element 146 between connections with thermoelements 142 and 144 so that a single diagnostic element 146 may be utilized to selectively form loops 154 and 156.

Figure 2B:
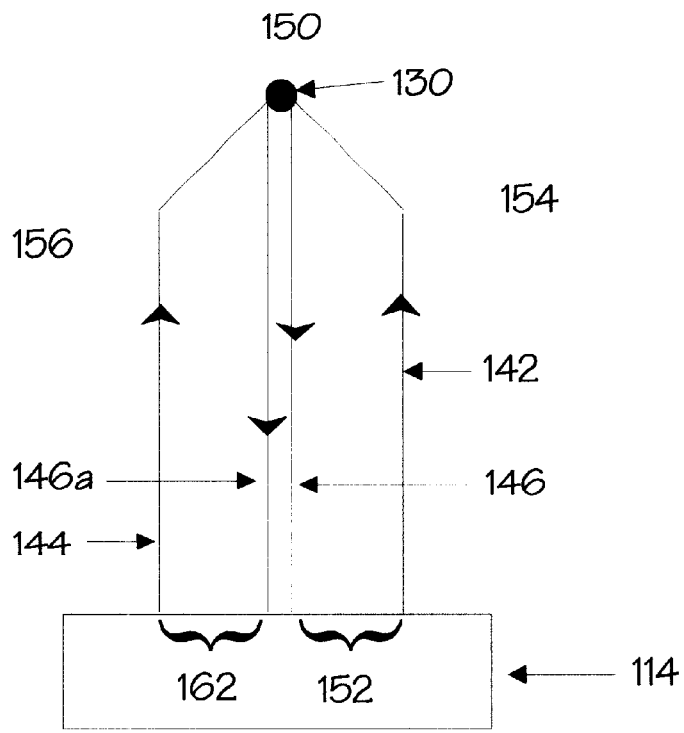
FIG. 2B is a diagram of a sensor in accordance with another embodiment of the present invention.

In alternative embodiments, however, a separate dedicated diagnostic element may be utilized to form each of loops 154 and 156. As an example, in an embodiment shown in FIG. 2B, a second diagnostic element 146a may be joined at weld junction 130 to form loop 156 with thermoelement 144. Diagnostic element 146 would then be utilized exclusively to form loop 154. However, the embodiment shown in FIG. 2A may be preferred over that of FIG. 2B because it uses a single diagnostic element and therefore may be easier to manufacture.

The selection of a diagnostic element is, in part, driven by the choice of thermoelements as well as other system parameters discussed herein. Certain types of diagnostic elements have characteristics which make them better suited to use with certain types of thermoelements. Table 1 lists examples of various alloys which may be utilized as a diagnostic element with different types of thermoelements. Table 1 is illustrative and is not intended to limit the present invention to any particular combinations of thermoelements and diagnostic elements shown.

TABLE 1

| T/C Type | Sensor Legs | Alloy | Resistivity $\mu\Omega \cdot cm$ | Resistance (24 AWG) ($\Omega$/ft) | Upper Temperature Limit (° C.) |
|---|---|---|---|---|---|
| T | Positive (+) | OFHC Cu | 1.724 | 0.0257 | 350 |
| | Negative (−) | 55Cu—44Ni | 48.9 | 0.7267 | 350 |
| | Diagnostic element(s) | ODS Cu | 2.25 | 0.0367 | 350 |
| | | Be | 4.0 | 0.0665 | 350 |
| | | BeCu | 6.8 | 0.115 | 350 |
| E | Positive (+) | 90Ni—9Cr | 70.6 | 1.053 | 900 |
| | Negative (−) | 55Cu—44Ni | 48.9 | 0.7267 | 900 |
| | Diagnostic element | Ni | 6.85 | 0.116 | 1200 |
| J | Positive (+) | Fe | 9.67 | 0.1513 | 750 |
| | Negative (−) | 44Cu—55Ni | 48.9 | 0.7267 | 750 |
| | Diagnostic element | Ni | 6.85 | 0.116 | 1200 |

TABLE 1-continued

| T/C Type | Sensor Legs | Alloy | Resistivity μΩ·cm | Resistance (24 AWG) (Ω/ft) | Upper Temperature Limit (° C.) |
|---|---|---|---|---|---|
| K | Positive (+) | 90Ni—9Cr | 70.6 | 1.053 | 1250 |
|   | Negative (−) | 94Ni—AlSiMg | 29.4 | 0.4396 | 1250 |
|   | Diagnostic element | 80Ni—20Cr | 108 | 1.609 | 1300 |
| N | Positive (+) | 84Ni—14Cr—1.4Si | 96.3 | 1.4363 | 1300 |
|   | Negative (−) | 95Ni—4.4Si—0.15Mg | 36.5 | 0.5458 | 1300 |
|   | Diagnostic element | 80Ni—20Cr | 108 | 1.609 | 1300 |
| R | Positive (+) | Pt—13%Rh | 19.6 | 0.293 | 1450 |
|   | Negative (−) | Pt | 10.4 | 0.160 | 1450 |
|   | Diagnostic element | ODS Pt 10%Rh | 19.24 | 0.321 | 1700 |
| S | Positive (+) | Pt—10%Rh | 18.9 | 0.289 | 1450 |
|   | Negative (−) | Pt | 10.4 | 0.160 | 1450 |
|   | Diagnostic element | ODS Pt 10%Rh | 19.24 | 0.321 | 1700 |
| B | Positive (+) | Pt—30%Rh | 19.0 | 0.283 | 1700 |
|   | Negative (−) | Pt—6%Rh | 17.5 | 0.270 | 1700 |
|   | Diagnostic element | ODS Pt 10%Rh | 19.24 | 0.321 | 1700 |
| G | Positive (+) | W | 5.65 | 0.084 | 2320 |
|   | Negative (−) | W—26%Re | 28.43 | 0.423 | 2320 |
|   | Diagnostic element(s) | Ta | 12.45 | 0.231 | 2625 |
|   |   | Re | 16.9 | 0.260 | 2500 |
|   |   | Mo | 5.2 | 0.0849 | 2000 |
| C | Positive (+) | W—5%Re | 11.8 | 0.176 | 2320 |
|   | Negative (−) | W—26%Re | 28.43 | 0.423 | 2320 |
|   | Diagnostic element(s) | W | 5.65 | 0.082 | 2725 |
|   |   | Ta | 12.45 | 0.231 | 2625 |
|   |   | Re | 16.9 | 0.260 | 2500 |
|   |   | Mo | 5.2 | 0.0849 | 2000 |
|   |   | Mo—50%Re | 15.5 | 0.258 | 1800 |
| D | Positive (+) | W—3%Re | 9.64 | 0.144 | 2320 |
|   | Negative (−) | W—25%Re | 28.26 | 0.421 | 2320 |
|   | Diagnostic element(s) | W | 5.65 | 0.082 | 2725 |
|   |   | Ta | 12.45 | 0.231 | 2625 |
|   |   | Re | 16.9 | 0.260 | 2500 |
|   |   | Mo | 5.2 | 0.0849 | 2000 |

As is apparent from Table 1, diagnostic element 146 may be constructed from various elements or alloys. A consideration in selecting a material for diagnostic element 146 is that it be more stable at the expected operating temperature range than any of the thermoelements with which it is being paired. However, especially in embodiments having multiple thermoelements, diagnostic element 146 may not be more stable than one or more of the thermoelements at the expected operating temperature range. Such embodiments remain within the scope of the present invention. For purposes of the present invention, an element or alloy that is less likely to have its resistance change relative to a second, similarly situated element or alloy as a result of manufacturing or operational stresses is considered more stable relative to an element or alloy that is. The term "stable" is used as one of ordinary skill in the metallurgical art would understand that term.

Sensor 110 may be constructed by any of the conventional methods now practiced by industry to fabricate metal sheathed mineral insulated cable, or by the stringing of hard fired insulators over the conductors. During the manufacturing process of a typical thermocouple sensor assembly, the wires of the thermocouple are swaged together and then welded. During the swaging process, a phenomena known as "necking" can occur. Necking can be described as the condition where along any given element length there is a non-uniform reduction in the element diameter resulting in areas where the element diameter is less than the nominal. When necking occurs, it can weaken the thermoelement. A thermoelement that has undergone necking has a higher likelihood of suffering premature degradation and ultimate failure than one that has not. Although quality control efforts can detect some instances of necking, a continued problem in the temperature measurement industry has been that not all such occurrences can be detected with reasonable quality control measures.

Necking is more likely to occur in the "weak" leg of a thermoelement. In this context, the weak leg is the thermoelement leg which has a lower tensile strength of the two thermoelement legs. Most traditional thermocouples have one leg which has a much higher tensile strength relative to the other leg of the thermocouple. The tensile strength of the thermocouple legs is not generally a primary concern in selecting thermoelement combinations. Other considerations such as the EMF generated by the thermoelement combination, the upper and lower use temperatures, frequency of the temperature cycles, severity of the temperature cycling, mechanical vibration, and any other conditions that may affect the stability of the thermoelements, are primary concerns in selecting thermoelement combinations. However, these same considerations are generally less important considerations in selecting a diagnostic element. Thus, greater consideration can be given to selecting a diagnostic element with a higher tensile strength. Such a diagnostic element will be less prone to suffer necking, further enhancing accuracy and stability. Additionally, such a diagnostic element will better able to withstand physical stresses under which it is placed in the manufacturing process or in operation.

A second phenomenon that may occur during the manufacturing of sensor 110 is the introduction of trace contaminants that can attack the thermoelements when operating at an elevated temperature. Such contaminants include sodium, chlorine, calcium, barium, lead and others. The presence of these contaminants causes premature degradation, and ultimately an untimely failure of one or more of the thermoelements. Some typical examples of thermoelements that are more susceptible to this attack are the negative legs of Types K, N, S and R thermocouples. A diagnostic element in accordance with the present invention can be manufactured of alloy combinations, such as those taught in Table 1, that lessen or eliminate the degrading effect of attack by trace contaminates.

In operation, a common operational stress to which a thermocouple sensor is subjected is that it is utilized in operating environments which exceed the recommended operating temperature of the thermocouple sensor. These various phenomena and operational stresses can result in such well known conditions as grain growth, intergranular attack, and metal transportation. The net result of these phenomena is that the resistance of one or more of the thermoelement wires can be altered. Typically, the resistance increases. Increasing the resistance renders temperature data generated from the thermoelement less accurate or, in a complete failure mode, nonexistent. While all thermoelements are degraded from various resistance-altering stresses, the rate at which they degrade can vary significantly. This phenomena is well known to those of skill in the temperature measuring art.

When a thermoelement does fail while in operation, the failure tends to occur at the transition zone between the weld junction and the thermoelement wire. Referring again to the embodiment of FIG. 2A, the expected point of failure is where thermoelements 142 and 144 are joined to weld junction 130. One technique that can be used in manufacturing a sensor assembly such as that of FIG. 2A is to laser weld the conductors together, or use chill blocks to mitigate the effects of one of the arc welding techniques when the conductors are fused together. The ability of the thermoelements to withstand these stresses is a measure of their stability. For reasons previously discussed, the diagnostic elements may be less prone to the resistance altering conditions. Thus, in a presently preferred embodiment, a consideration in selecting a diagnostic element is that it be more stable at expected operating temperatures than the thermoelements with which it is being paired in the sensor.

In addition to the elements listed in Table 1, other suitable materials from which diagnostic element 146 may be constructed include metallic elements such as copper, gold or any suitable alloy that satisfies the stability requirements as previously discussed. As with the choice of thermoelements, an important consideration in selecting a diagnostic element is that it be suitable for use over the expected operating temperature of the sensor 110. In some instances, diagnostic element 146 will have a resistance which is much less than the resistance of thermoelement 142. In these situations, the diagnostic element will form a relatively small portion of the total resistance of the thermocouple/diagnostic element loop 154. Such combinations are apparent from Table 1. With a diagnostic element having a lower resistance than any of the other portions of the loop, any loop which includes the diagnostic element as one leg will have a lower loop resistance than any loop formed only by thermoelements. Such a configuration provides a circuit with an increased ability to detect initial changes in the resistance in any of the thermoelement legs, which is a precursor to thermoelement failure.

Figure 3:
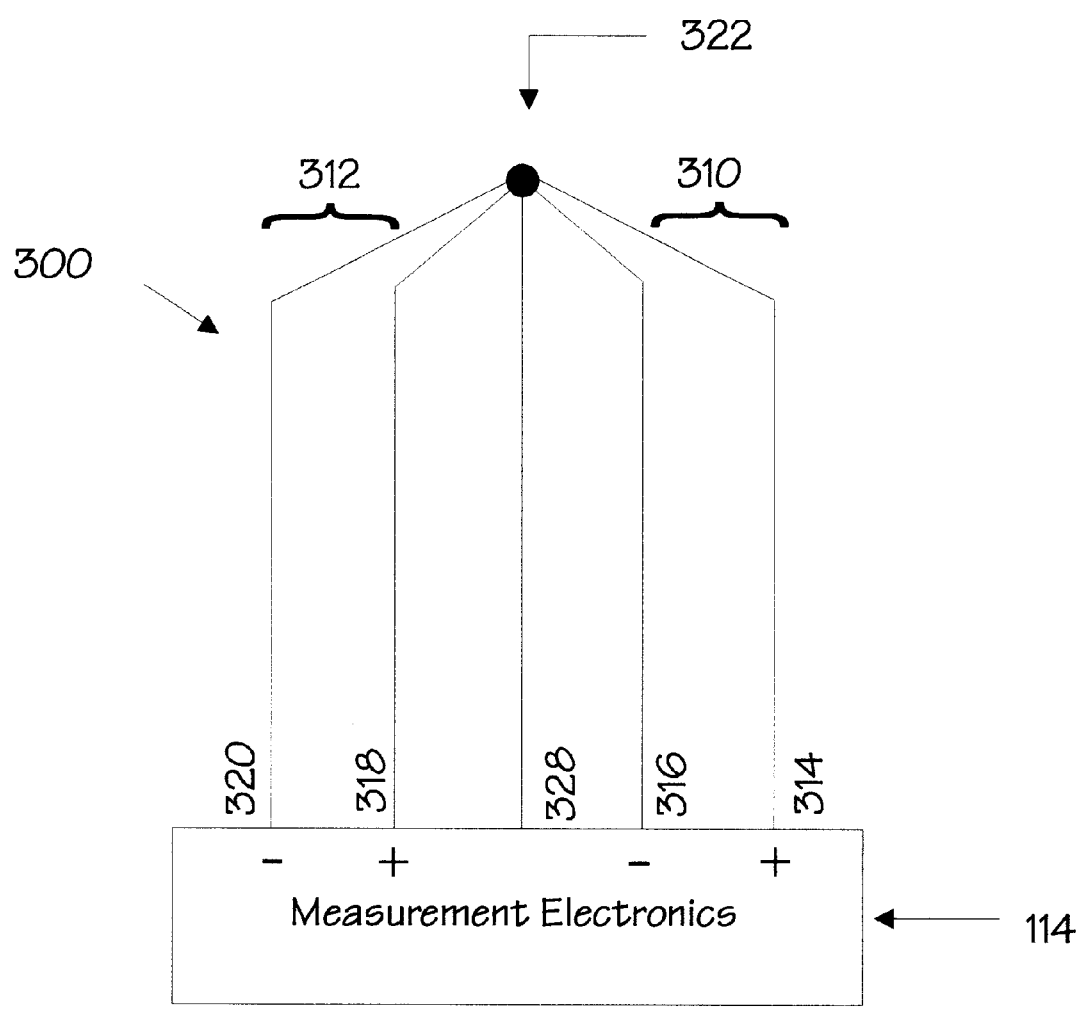
FIG. 3 is a diagram of a sensor in accordance with a presently preferred embodiment of the present invention.

FIG. 3 is a diagram of a sensor 300 in accordance with a presently preferred embodiment of the present invention. Sensor 300 includes two distinct thermocouples 310, 312, each having two thermoelements 314,316 and 318, 320, respectively. Thermoelements 314 and 316 are joined at weld junction 322. Likewise, thermoelements 318 and 320 are joined at weld junction 322. Diagnostic element 328 is also joined to weld junction 322. It is preferred that diagnostic element 328 be joined at weld junction 322 as most in-use failures of a thermoelement occur at or near the weld junction of the thermocouple. In the embodiment of FIG. 3, a single diagnostic element 328 is utilized to form thermoelement/diagnostic element loops with each of thermoelernents 314, 316, 318, and 320.

In alternative embodiments, an additional diagnostic element may be added to sensor 300 to create additional thermoelement/diagnostic element loops with one or more of thermoelements 314, 316, 318 or 320. However, the single-diagnostic-element construction is presently preferred over the use of multiple diagnostic elements primarily because of ease of fabrication and reliability enhancements achieved with a single-diagnostic-element construction. Measurement electronics 114 can be configured to selectively connect diagnostic element 328 with any of thermoelements 314, 316, 318, 320.

In the example of FIG. 3, each thermoelement of each thermocouple is manufactured of a different temperature-dependent material. For example, thermoelement 314 is manufactured from a different material than thermoelement 316. Moreover, thermocouples 310, 312 may be manufactured from any thermocouple combination pair that meets the operating temperature requirements. That is, thermoelements 314 and 318, like thermoelements 316 and 320, may be manufactured from different pairs of thermocouple materials.

Thermoelements 314, 316, 318, 320 are wires which will vary in length and diameter depending on system parameters. In one embodiment, thermoelements 314 and 318 are manufactured of CHROMEL P and thermoelements 316 and 320 are manufactured of ALUMEL. It is to be understood that the present invention is not limited to the embodiments shown in FIG. 2A, 2B, 2C, and 3. Alternative embodiments include the addition of one or more thermoelements or thermocouples or diagnostic elements to the embodiments of FIG. 2A, 2B, 2C, or 3.

Figure 4:
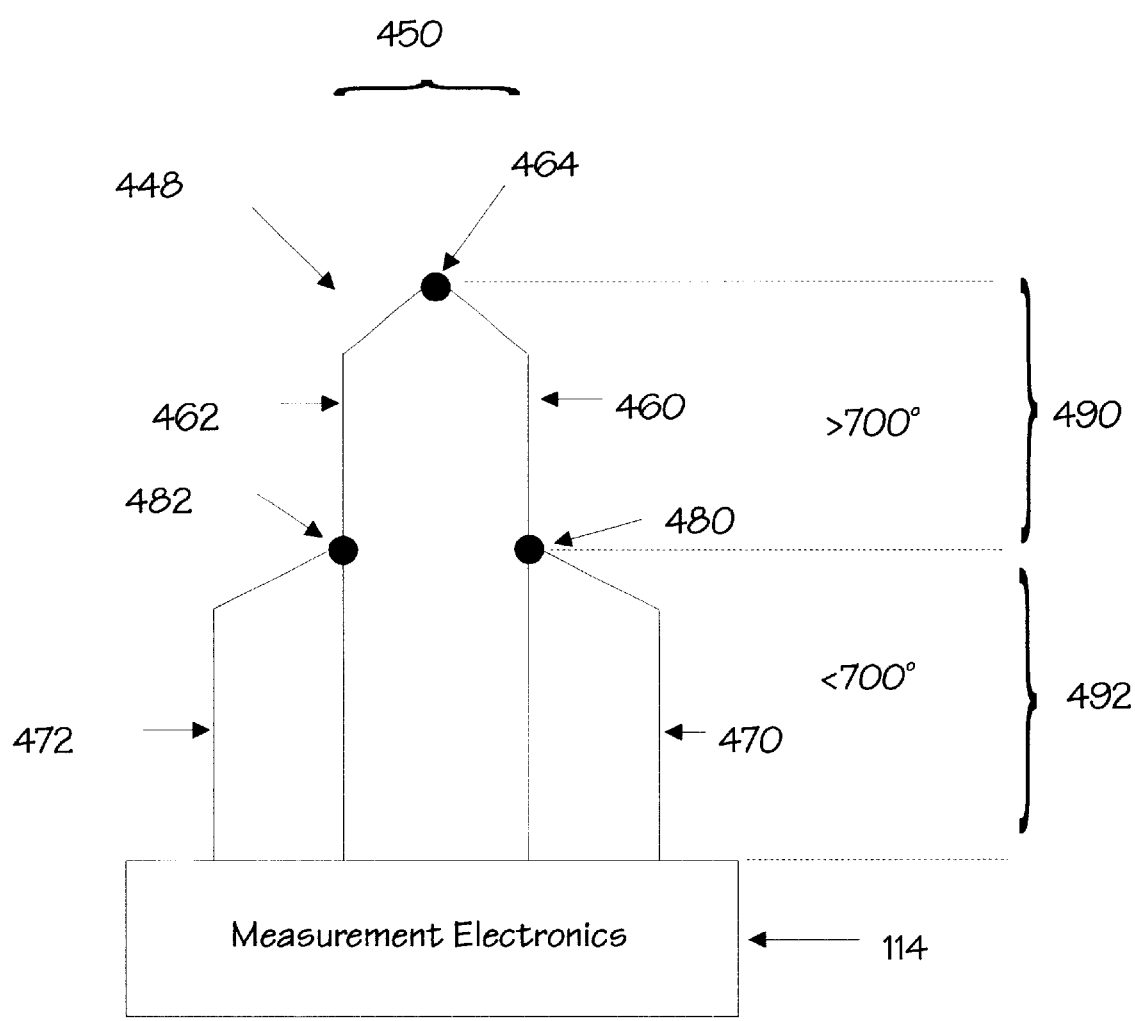
FIG. 4 is a diagram of a sensor in accordance with a fifth embodiment of the present invention.

FIG. 4 is a diagram of a sensor 448 in accordance with a fifth embodiment of the present invention. Sensor 448, as shown in FIG. 4, includes a thermocouple 450 consisting of a first thermoelement wire 460 and a second thermoelement wire 462. Thermoelement wires 460 and 462 are joined at weld junction 464. Diagnostic element 470 is joined to thermoelement 460 at weld junction 480. Diagnostic element 472 is joined to thermoelement 462 at weld junction 482. Because diagnostic elements 470 and 472 are joined to thermoelement wires 460 and 462 at weld junctions 480 and 482 instead of at weld junction 464, diagnostic elements 470 and 472 may be exposed to a lower operating temperature range than they would if they were joined at weld junction 464. In an exemplary system, thermocouple sensor 448 may be in an operating environment where a first portion 490 of the sensor 448 will be exposed to temperatures in excess of 700° C. and a second portion 492 of the sensor 448 will be exposed to temperatures less than 700° C. One of ordinary skill in the temperature measuring art will readily understand that a thermocouple sensor such as shown in FIG. 4 would experience a temperature gradient. In selecting the appropriate embodiment of the present invention for a given operating system, the expected temperature gradient is a design factor which may determine the position of weld junctions 480 and 482 along thermoelements 460 and 462.

Figure 2C:
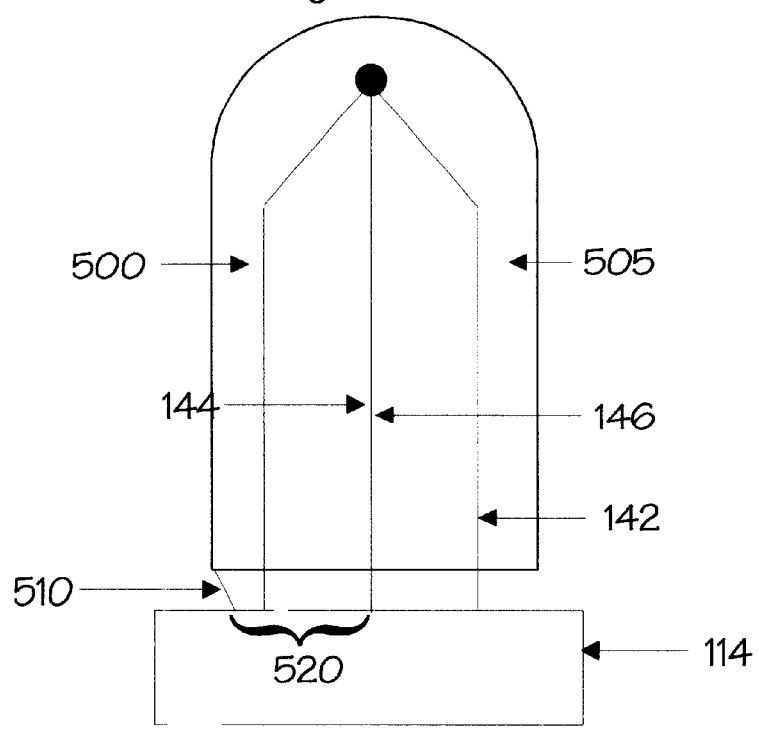
FIG. 2C is a diagram of a sensor in accordance with another embodiment of the present invention.

Sensors may be enclosed in protective sheaths made of various materials, including some that are electrically conductive. FIG. 2C is a diagram of another embodiment of the present invention wherein a thermocouple sensor is enclosed in an electrically conductive sheath material 500 wherein the thermoelements 142 and 144 and diagnostic element 146 are insulated from the protective sheath by insulating material 505. A common mode of failure in thermocouple sensors such as shown in the embodiment of FIG. 2C is for electrically conductive paths to be formed in the insulating material 505 causing short circuiting of the electrical signals in the thermoelements and false readings. This is commonly referred to as "virtual junction" error.

In the embodiment depicted in FIG. 2C, the insulation resistance may also be measured along with the various loop resistances using sheath wire 510 connected to sheath 500. Sheath wire 510 is an electrically conductive element which electrically connects sheath 500 to measurement electronics 114. Measurement electronics 114 is capable of selectively connecting sheath wire 510 with either of thermoelements 142 or 144 or diagnostic element 146. As an example, measurement electronics 114 can connect sheath wire 510 with diagnostic element 146 thereby forming measurement circuit 520. The resistance between sheath 500 and diagnostic element 146 can then be measured by measurement circuit 520. Any thermoelement inside sheath 500 can also be used in combination with sheath wire 510 to form measurement circuit 520. A resistor or diode (not shown) may also be placed in sheath wire 510 to prevent small currents or ground loops from being transferred to measuring circuit 520. A 1000Ω resistor or equivalent diode is presently preferred. Because diagnostic element 146 and sheath 500 and sheath wire 510 are electrically insulated by insulating material 505, high resistance should exist in circuit 520. However, the sensor may be in an operating environment where trace materials or broken down insulation 505 causes electrical pathways to form between sheath 500 and thermoelements 142, 144 or diagnostic element 146. This phenomenon can be detected by monitoring the resistance of measuring circuit 520 and comparing it to reference calibration data. When the resistance of measuring circuit 520 falls below a predetermined threshold, a diagnostic signal indicating possible virtual junction error can be sent to computer 116 and display 120. Further, an indication of the impending failure of the sensor can be provided that predicts the failure before it happens, thereby lessening the possibility of outputting incorrect data. It is to be understood that sheath wire 510 may also be added to various other embodiments of the present invention having additional thermoelements and/or diagnostic elements. As one example, sheath wire 510 may be added to the embodiment shown in FIG. 3.

Figure 5:
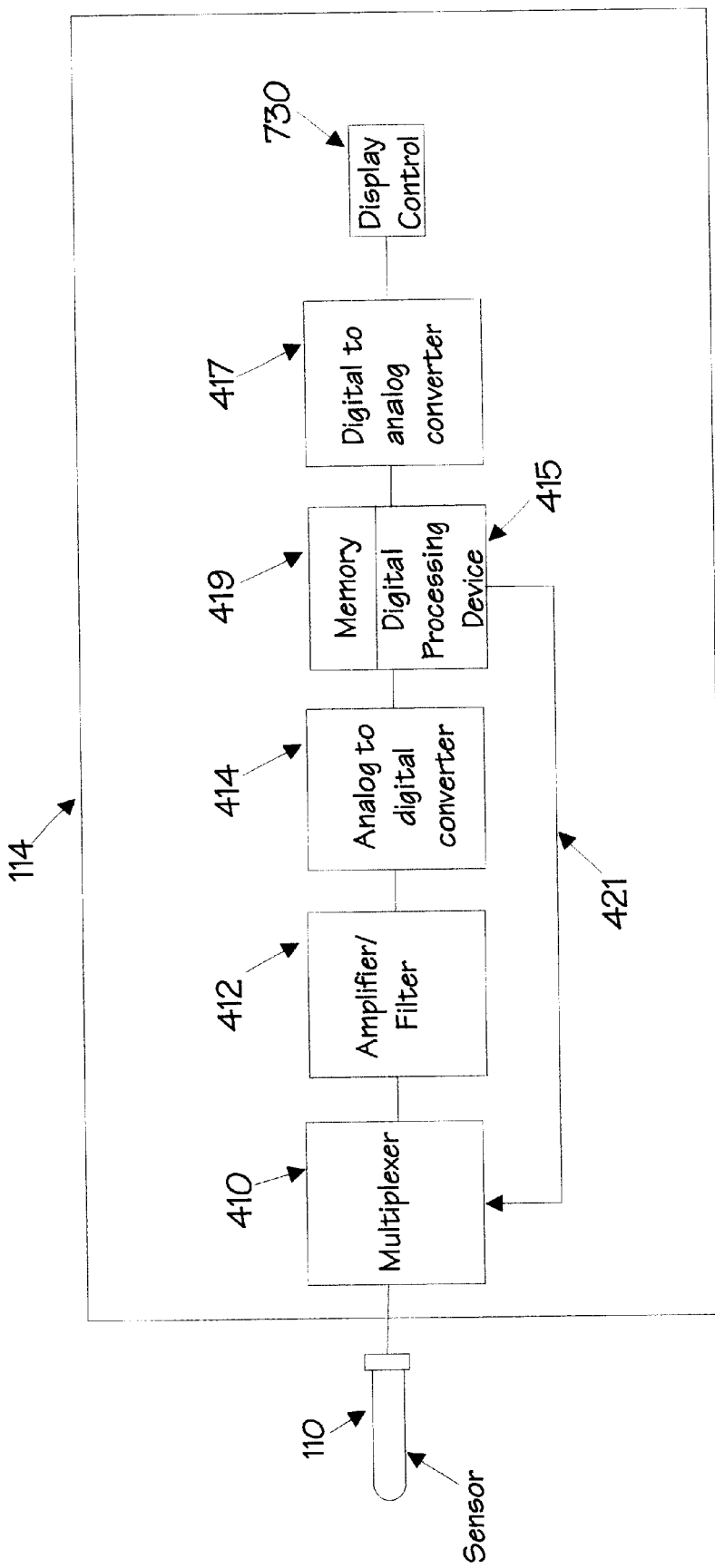
FIG. 5 is a functional block diagram illustrating exemplary measurement electronics for use with a device as shown in FIG. 1.

FIG. 5 is a functional block diagram illustrating exemplary measurement electronics 114 for use with a device 100 as shown in FIG. 1. As shown in FIG. 5, measurement electronics 114 may include a multiplexer (MUX) 410, a combined amplifier/filter circuit 412, an analog to digital converter (ADC) 414, a processor 415, and a digital-to-analog converter (DAC) 417. The output of DAC 417 is coupled to display/control 730. Processor 415 executes instructions encoded in software stored in memory 419, which may include random access memory and/or read only memory. The software can be downloaded into memory from a hard drive or removable data storage media drive associated with computer 116.

MUX 410 operates under control of processor 415, as indicated by line 421, to select particular voltage and resistance signals from the thermoelements and pass those signals to amplifier/filter circuit 412. In particular, MUX 410 combines the outputs of selected pairs of thermoelement combinations or thermoelement and diagnostic element combinations to provide resistance measurements indicative of thermoelement degradation. MUX 410 allows the injection of a known current into sensor 110 for resistance measurement if such a measurement is desired. In addition, MUX 410 allows selection of forward or reverse reading of the loops formed within sensor 110.

Amplifier/filter circuit 412 receives the selected signals from MUX 410. The filter performs anti-aliasing to improve the noise performance of ADC 414. The amplifier provides a high-input impedance to reduce the effect of the resistance of the MUX 410 switches. ADC 414 can be realized by a high resolution Sigma-Delta analog-to-digital converter. ADC 414 converts the resistance and voltage data into one or more digital values representing the data signature of a particular diagnostic loop. These digital values may then be passed to processor 415 for further processing, and eventually to computer 116 to present the result on display 120, if desired. Display 120 may take the form of a conventional computer display such as a CRT or flat panel monitor or a PLC or DCS. Alternatively, processor 120 can be implemented via a separate alphanumeric display, such as a plasma, LCD, or LED device. As an alternative, processor 415 can be programmed to drive display 120 directly. Also, processor 415 can be programmed to provide control signals, based on temperature or diagnostic measurements, that drive control circuitry associated with a particular process being monitored. DAC 417 converts digital signals generated by processor 415 to analog signals representative of measurements for presentation to display/control 730.

Computer 116 receives the digital signal output by processor 415. Computer 116 is preferably a standard microcomputer comprising a central processing unit (CPU), random access memory (RAM), and display 120. Device 100 is not restricted, however, by any particular architecture of computer 116. As is well understood by those of ordinary skill in the art, computer 116 executes software 118 stored in RAM to performed desired functions. Computer 116 also may provide a user interface that allows a user to reconfigure processor 415 by downloading changes to memory 419. One of skill in the art will understand that measurement electronics 114 could be integrated with computer 116. In particular, measurement electronics 114 may take the form of a computer card or circuit board that is connected to or coupled within computer 116.

One method of operation of device 100 will now be described. In a preferred embodiment, device 100 will output a system temperature to an operator and will notify the operator when one or more thermoelements in sensor 110 suffer from a predetermined level of degradation. The operation of the embodiment of FIG. 2A will be described, although it is to be understood that any of the various embodiments of the invention operate in the same general manner as hereinafter set forth.

With regard to the embodiment of FIG. 2A, the operation is as follows. In the presently preferred embodiment various resistance values are measured. It is to be understood that impedance values could be measured as an alternative to measuring resistance. An initial loop resistance is measured for loops 154 and 156. Preferably this measurement is taken as a part of calibration testing. This initial operating condition ("IOC") data is then stored in a calibration matrix and a calibration reference is formed from the IOC data. During subsequent operation, periodic measurements of the loop resistance for loops 154 and 156 are taken and compared against the IOC data. When the resistance of either loop 154 or 156 has changed a predetermined amount from the IOC data, an alert signal is sent to an operator. The operator then knows that some portion of the loop has begun to undergo an increase in resistance.

Because, in a preferred embodiment, thermoelements 142 and 144 are paired with diagnostic element 146 which is more stable at the operating temperature of the thermocouple sensor 110 than either of the thermocouple elements, e.g., more resistant to grain growth, intergranular attack, metal transportation or other resistance-altering conditions than the thermoelements, the operator may assume that any increase in resistance in the thermoelement/diagnostic element loop 154 or 156 is occurring because of degradation of the thermoelement and not degradation of the diagnostic element.

In addition to the collection of resistance data, voltage measurements can be taken using well known techniques. Again using FIG. 2A as an illustrative example, a primary voltage reading is taken across thermoelements 142 and 144 (thermocouple 150). Secondary voltage readings may be taken across thermoelement 142 and diagnostic element 146 and thermoelement 144 and diagnostic element 146. Secondary resistance readings may also be taken around a loop formed by thermoelements 142 and 144. The secondary voltage and resistance readings provide additional evaluation and analysis of thermocouple 150.

The foregoing illustrates an additional advantage provided by the presence of diagnostic element 146. In addition to its primary function of providing a diagnostic element which completes loops 154 and 156 and allows a loop resistance for each to be determined, diagnostic element 146 can be paired with either of thermoelement wires 142 and 144 to form a non-traditional thermoelement combination. These two additional non-traditional thermoelement combinations may be used to determine a reference temperature against which the temperature being measured by traditional thermocouple 150 may be checked.

As a second example, the operation of device 100 using sensor 300 of FIG. 3 is detailed. Each individual thermocouple combination, comprised of various combinations of thermoelements 314, 316, 318, 320, generates an electromotive force (EMF) which correlates in a consistent manner with temperature over a usable temperature range. Diagnostic element 328, in various combinations with thermoelements 314, 316, 318, and 320, may also generate an EMF which correlates in a consistent manner with temperature over a usable temperature range. Resistance is calculated by injecting a known current into one or more pairs of thermoelement or thermoelement/diagnostic element loops and measuring the voltage generated.

Each pair of thermoelement or thermoelement/diagnostic element loops can be selected from any two thermoelements 314, 316, 318, 320 and diagnostic element 328 not in the other pair. The measurements taken are compensated for thermoelement EMF due to temperature. Since the electrical characteristics of the thermoelements 314, 316, 318, 320 and diagnostic element 328 at particular temperatures have been calibrated, the temperature of the system can be determined from the electrical signals measured from multiwire sensor 300.

In one embodiment, a combination of thermoelements may be chosen to be a primary sensor while the remaining thermoelements form a secondary sensor. For example, thermocouple 310 can be selected as the primary sensor while measurements taken from the other thermoelements 318, 320, and diagnostic element 328 (and different combinations of thermoelements 314 and 316) form the secondary sensor.

Figure 6:
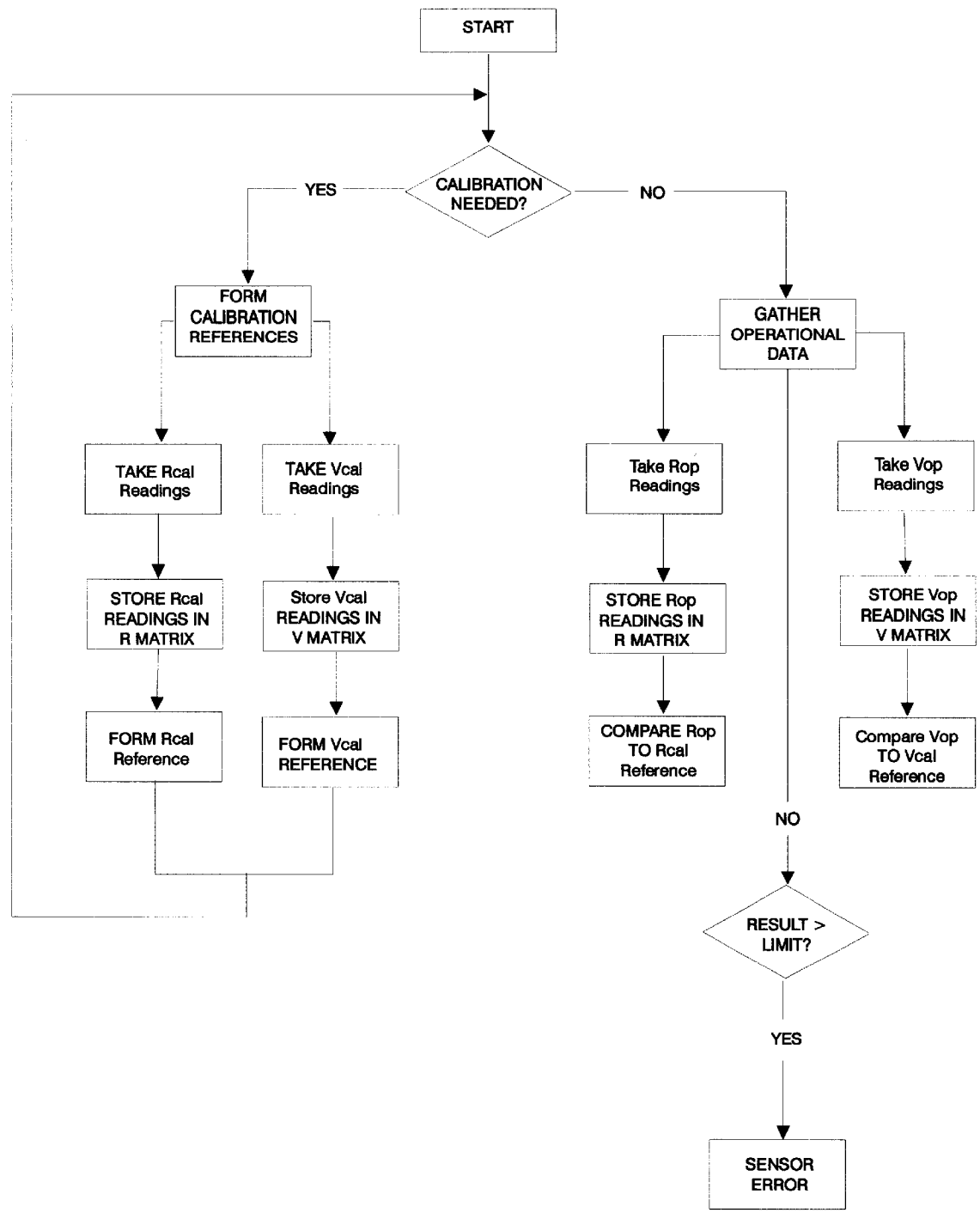
FIG. 6 is a flow diagram that illustrates a measurement processing routine in accordance with an embodiment of the present invention.

FIG. 6 is a flow diagram that illustrates a measurement processing routine that can be carried out by measurement electronics 114 to perform diagnostic checks on a sensor. Upon the start of the routine, indicated by block 602, processor 415 determines if the necessary calibration reference or references have been formed, as indicated by block 610. In a preferred embodiment, a resistance calibration reference is always formed. In other embodiments, a voltage calibration reference may also be formed. If the desired calibration references have been formed, then processor 415 proceeds to the data gathering routine, as indicated by block 654. If calibration references need to be formed, the processor 415 proceeds to a calibration routine, as indicated by block 629. In a preferred embodiment, the creation of the voltage and resistance calibration references is done by placing the sensor assembly in a calibration oven. The oven is cycled over the expected operating temperature range of the sensor assembly. The calibration reference is a series of voltage and resistance values measured over the entire temperature range. It is to be understood that this process to develop the calibration reference can also be performed separately by one of ordinary skill in the art.

FIG. 6 illustrates the acts involved in creating the resistance and voltage calibration references. As indicated by block 630, resistance calibration readings are taken. These resistance calibration readings may also be referred to as the Initial Operating Condition ("IOC") resistance data. As indicated by block 632, the IOC resistance data is stored in the resistance calibration matrix. As indicated by block 634, a resistance calibration reference is formed from the IOC resistance data. As indicated by block 640, voltage calibration measurements are taken. These voltage calibration measurements may also be referred to as IOC voltage data. As indicated by block 642, the IOC voltage data is stored in the voltage calibration matrix. It is to be understood that IOC resistance and voltage data may also be stored in a single matrix rather than two separate matrices. As indicated by block 644, a voltage calibration reference is formed from the IOC voltage data. In both matrices, the data is categorized as to which thermoelement generated each datum. Then, each datum is placed in the matrix at a location determined by the category in which the datum resides.

Once the calibration references have been formed, processor 415 will proceed to the beginning, as indicated by loop 645, and gather operational data, as indicated by block 654. As indicated by block 660, operational resistance readings are taken. As indicated by block 662, the operational resistance data is placed in the resistance matrix. As indicated by block 664, the operational resistance data is compared to the resistance reference. As indicated by block 666, a determination is made as to whether the difference between the operational resistance and the reference resistance exceeds a threshold. If the threshold has been met or exceeded, one or more of the thermoelements in the sensor is no longer operating within acceptable limits-of-error and, as indicated by block 668, processor 415 sends a notification to the system operator and may automatically take those elements out of service. If the threshold is not met, the cycle is repeated after a predetermined interval, as indicated by loop 669.

It is to be understood that the preferred method of monitoring the condition of the thermocouple is by monitoring changes in resistance in the resistance measuring loops. However, an additional calibration check may be done using voltage measurements. If it is desired to perform an additional calibration check using voltage data, operational voltage readings are taken, as indicated by block 670. As indicated by block 672, the operational voltage data is placed in the voltage matrix. As indicated by block 674, the operational voltage data is compared to the voltage reference. As indicated by block 666, a determination is made as to whether the difference between the operational voltage and the reference voltage exceeds a threshold. If the difference between the voltage reference and the operational voltage exceeds the threshold, one or more of the thermoelements in the sensor is no longer operating within acceptable limits-of-error and, as indicated by block 668, processor 415 sends a notification to the system operator and may automatically take those elements out of service. If the threshold is not met, the cycle is repeated after a predetermined interval beginning as indicated by loop 669.

In various alternative embodiments, processor 415 may read data from both a primary sensor, which is formed from a subset of the thermoelements and diagnostic element within sensor 110, and the remaining thermoelements either by periodic sampling of the thermoelements or by continuous monitoring of the thermoelements. Processor 415 may also read data from several sensors at the same time or from each sensor sequentially, depending on specific system requirements. It is also to be understood that measurement electronics 114 may be separated from computer 116, and configured as a discrete device, e.g., with an integrated display and user interface.

In addition to apprising the operator of potential inaccuracies, and allowing replacement of sensor 110, degradation monitoring allows dynamic reconfiguration of the sensor without replacement. In the event that one thermoelement leg of sensor 110 has degraded beyond acceptable levels, sensor 110 can be "rearranged." As an example, in the embodiment of FIG. 3, the primary and secondary sensor selection can be changed. In particular, upon significant degradation, the operator may enter a command via a user interface associated with computer 116 whereby processor 415 controls MUX 410 to select a different thermocouple loop for temperature measurement, or to form a new thermocouple loop using thermoelements that have not exhibited appreciable degradation. As an alternative, processor 415 can be programmed to automatically search for a new thermocouple loop in the event of degradation, without the need for operator intervention. In either case, sensor 110 and measurement electronics 114 permit "on-the-fly" adjustment of the sensor for increased accuracy and confidence without the need to remove or replace the sensor. Consequently, there is no need to disrupt the process being monitored.

Figure 7:
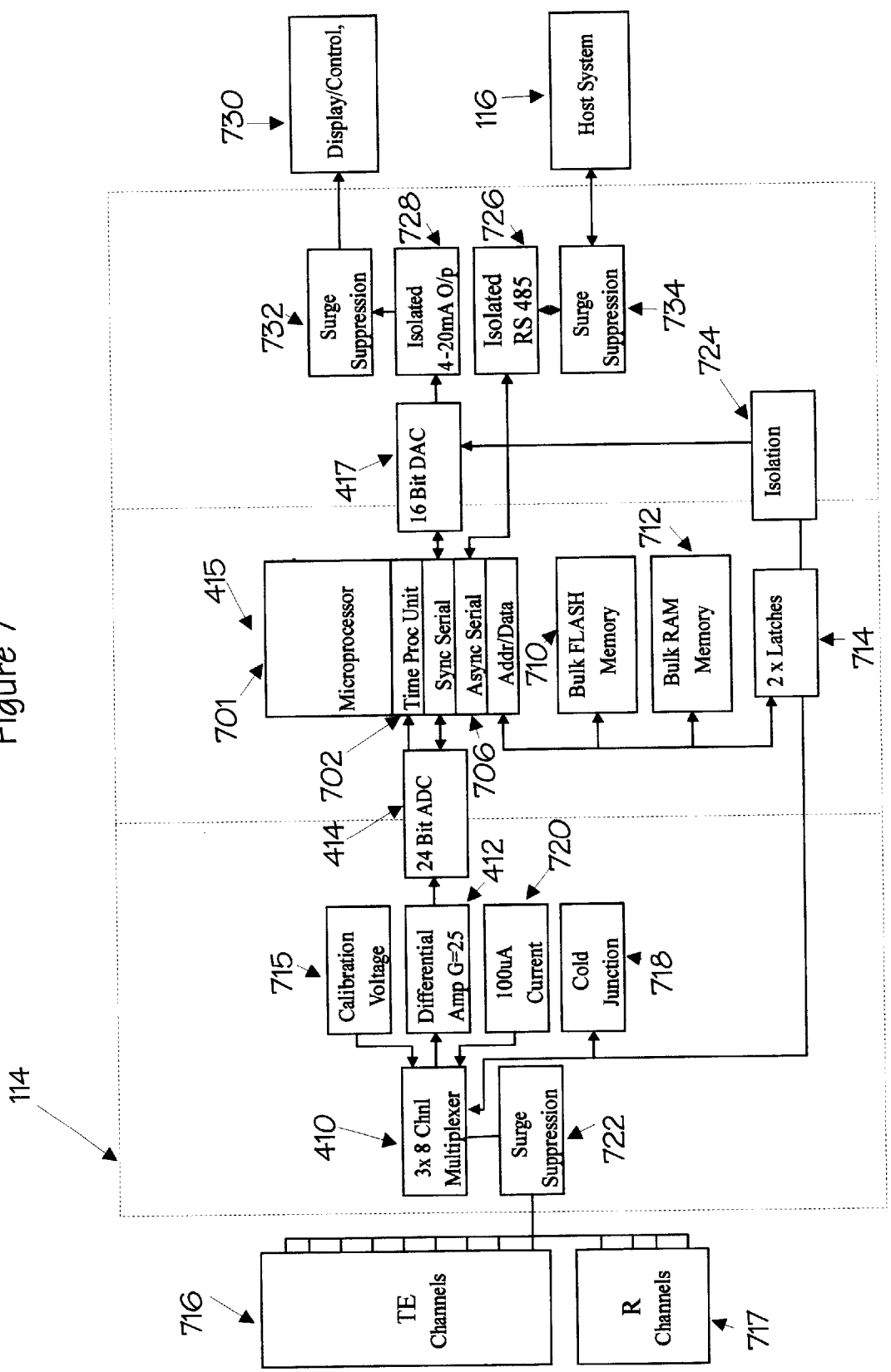
FIG. 7 is a functional block diagram illustrating the measurement electronics of FIG. 5 in greater detail.

FIG. 7 is a functional block diagram illustrating an exemplary embodiment of measurement electronics 114 of FIGS. 1 and 5 in greater detail. In the embodiment of FIG. 7, measurement electronics 114 take the form of a variety of components mounted on a common circuit board that communicates with a host computer 116. As shown in FIG. 7, measurement electronics 114 include processor 415, which may take the form, e.g., of a Motorola 68332 is microprocessor. The 68332 microprocessor, for purposes of example, includes a 32-bit core processor 701, and a 16-channel time processor unit (TPU) 702, and Queued Serial Module (QSM) that contains a synchronous serial port 704 and an asynchronous serial port 706. Processor 415 accesses both Flash memory 710 and static random access memory (RAM) 712 through a 20-bit address and 16-bit data bus 708.

Data bus 708 is also latched to MUX 410 via latches 714. MUX 410 is used to select one of a plurality of thermoelement channels 716 and resistance channels 717 to be measured by ADC 414, which may be a 24-bit ADC. Each thermoelement channel 716 provides the output of a thermoelement, whereas each resistance channel 717 provides the output of a diagnostic element. MUX 410 is controlled to selectively combine respective thermoelement channels 716 in pairs to provide thermocouple measurement loops, and to selectively combine resistance channels 717 with thermoelement channels 716 in pairs to form degradation check loops for degradation monitoring.

Both ADC 414 and a 16-bit DAC 417 are connected to processor 415 via synchronous serial port 704. ADC 414, and DAC 417 are controlled through synchronous serial port 704 and interrupts received via TPU 702. A cold junction temperature sensor 718 is controlled via latches 714, and is provided for the purpose of temperature calibration, as will be explained.

MUX 410 may take the form of a combination of three 8-input multiplexers. MUX 410 is coupled to the input of amplifier/filter circuit 412, which may take the form of a differential amplifier with a resistor-capacitor feedback network selected to reduce aliasing in the signal received from the MUX. A voltage calibration source 715 and constant current source 720 also are electrically coupled to MUX 410.

Processor 415 controls the three multiplexers forming MUX 410 via latches 714 to select which of the system inputs, i.e., thermoelement channels 716 and resistance channels 717, will be measured. When taking data from the thermoelement inputs, two of the multiplexers provide a differential input to amplifier/filter circuit 412. When resistance measurements are selected, the third multiplexer is enabled, and provides a constant current generated by current source 720 to the selected resistance channel 717. The constant current enables amplifier/filter circuit 412 to acquire the resultant voltage drop across the thermoelement/diagnostic element pair.

In operation, for temperature measurement, processor 415 controls one of the multiplexers of MUX 410 to select one of thermoelement channels 716, and controls another multiplexer to select a second thermoelement channel. MUX 410 thereby combines two thermoelements to form a temperature measurement loop, and passes the signal from the thermoelements to the inputs of differential amplifier/filter circuit 412. In this way, the loop is measured across the differential input of amplifier/filter circuit 412 to provide an indication of the temperature in the area in which sensor 110 is positioned.

For resistance measurement, and thus degradation monitoring, processor 415 controls two of the multiplexers of MUX 410 to select one of thermoelement channels 716. Also, processor 415 controls the third multiplexer of MUX 410 to enable the constant current generator 720, such that the MUX combines a selected thermoelement with a selected diagnostic element. MUX 410 transmits the signal from the selected thermoelement to a first input of amplifier/filter circuit 412, and transmits the signal from the selected diagnostic element to a second input of the amplifier/filter circuit. The resultant differential signal is amplified by amplifier/filter circuit 412, and provides an indication of the degree of degradation of the selected thermoelement. Processor 415 may control MUX 410 to take a degradation measurement for each of the thermoelements, allowing the operator to assess the relative accuracy of the thermocouples used in sensor 110.

As further shown in FIG. 7, the analog inputs from channels 716, 717 can be surge protected and fused. A sheath resistance measurement circuit 520 (FIG. 2C) also can be provided to allow determination of insulation integrity between the sensor sheath and the thermoelements. The sheath resistance measurement can be selectively acquired via channels 716, 717 and an additional channel connected to the sheath. During calibration, ADC 414 is used to measure both an offset and a span for the measurement system including the multiplexers. This requires that voltage calibration source 715 be switched in at the multiplexer. Calibration may occur when the board is reset. Also, calibration may occur whenever cold junction temperature sensor 718 detects a change in ambient temperature greater than a predetermined amount, e.g., +/−0.02 degrees Celsius.

With further reference to FIG. 7, measurement electronics 114 also may include an output section that includes electrical isolation circuitry 724 for communication between latches 714 and DAC 417, as well as isolated RS485 output 726 for communication between asynchronous serial port 706 and the host computer system 116, and an isolated 4–20 mA output 728 for communication between the DAC and display or control circuitry 730. Surge suppressors 732, 734 can be interposed, respectively, between output 728 and display/control circuitry 730, and between RS485 output 726 and host computer 116. DAC 417 transmits signals to display/control circuitry 730 to drive the display of information, e.g., on a display monitor or an LED or LCD device, concerning temperature measurement and thermoelement degradation and/or to drive a controller to adjust parameters associated with the process being monitored. Upon measurement of a temperature that is outside of a desired range, processor 415 may transmit, via DAC 417 and output 728, an error signal for temperature control within the apparatus used to perform the process being monitored. Asynchronous serial port 706 transmits and receives signals from computer 116 for initialization of measurement electronics 114.

Figure 8:
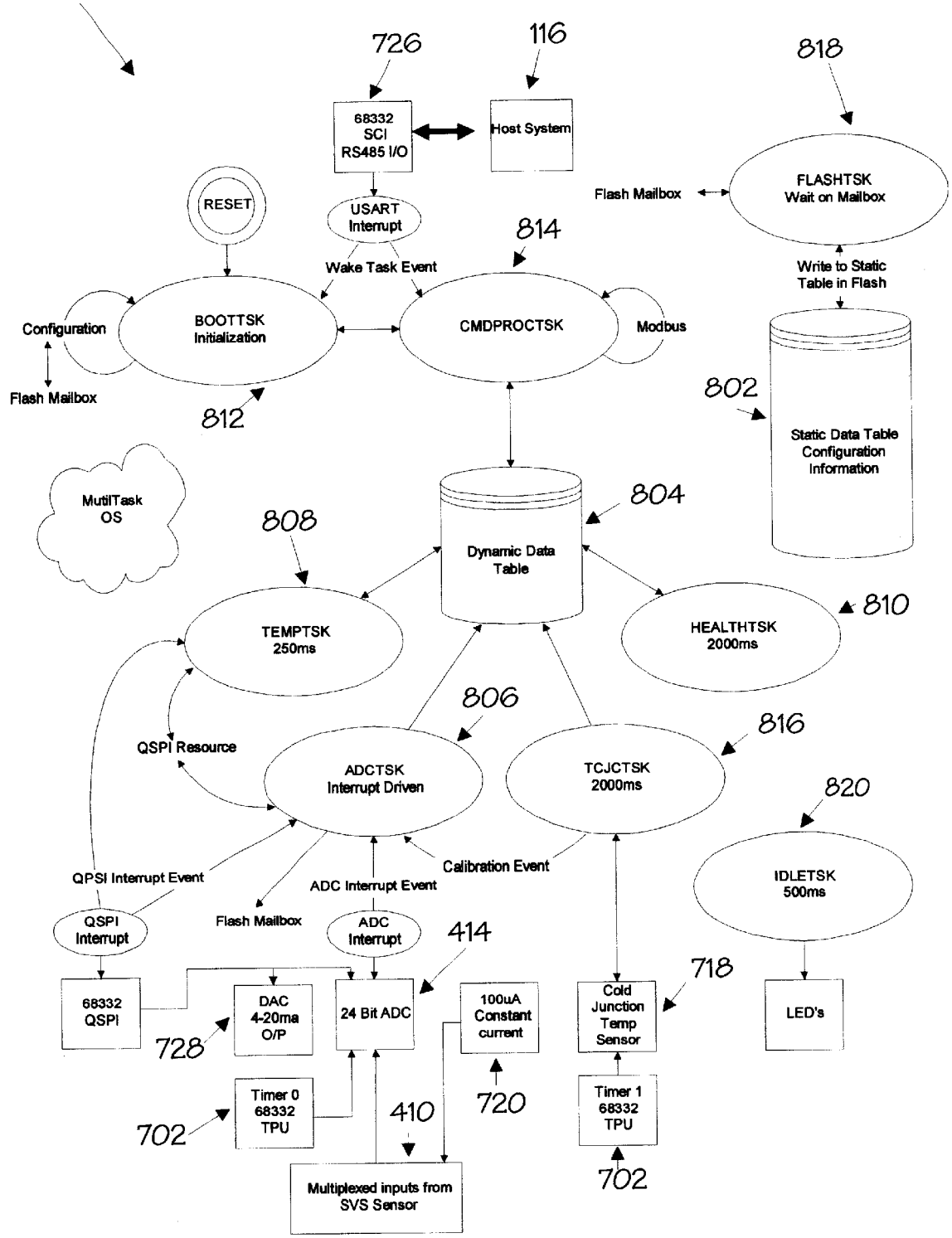
FIG. 8 is a state diagram illustrating the operation of an exemplary implementation of the measurement electronics of FIG. 7.

The operations of processor 415 can be implemented in code built on top of a multitask operating system (MTOS). Accordingly, the detailed operation of measurement electronics 114, in one embodiment, will be described in terms of particular tasks executed within the operating system. FIG. 8 is a state diagram illustrating an exemplary multitasking implementation of measurement electronics 114 of FIG. 7. With reference to FIG. 8, operating system 800 can be made to accommodate two data tables. In particular, operating system 800 makes use of a static data table, indicated by reference numeral 802, which holds static configuration information and a dynamic data table, indicated by reference numeral 804, that handles dynamic data. Dynamic data table 804 may form part of RAM memory 712. All modules and tasks within system 800 are able to retrieve and save data in tables 802, 804 via a global pointer to each of them. Dynamic data table 804 provides a demarcation line between tasks within system 800 that collect and calculate data and those that return the data to host computer 116. This feature allows the collection of data and the transmission of data to proceed asynchronously. A number of system tasks will be described in detail below.

In this exemplary embodiment, the system 800 implemented by measurement electronics 114 includes an ADC Task (ADCTSK), indicated by reference numeral 806, that generally runs is constantly to change the mutiplexer switches in MUX 410, and start conversions at ADC 414. ADCTSK waits for an interrupt to indicate that a conversion is ready. The conversions are read into an array, which is used to store the numbers for a sliding window average. ADCTSK also can be used to perform calibration of ADC 414, amplifier/filter 412, MUX 410, sensor 110, and sensor cable and multiplexer resistance measurements. Calibration occurs at initialization of measurement electronics 114, and whenever cold junction sensor 718 detects an ambient temperature shift, e.g., of +−0.02 degrees C. Processor 415 controls MUX 410 to collect data from sensor 110 for resistance measurements, e.g., every second.

Thermocouple EMF measurements and resistance EMF measurements acquired via MUX 410 are stored in dynamic data table 804 and are used by a Temperature Task (TEMPTSK), indicated by reference numeral 808, and Health Task (HEALTHTSK), indicated by reference numeral 810, to create temperature and resistance values, respectively, which are also stored in the dynamic data table. A Boot Task (BOOTTSK), indicated by reference numeral 812, verifies the system configuration in static data table 802, and creates the memory required for dynamic data table 804. The BOOTTSK is also used when a configuration is to be downloaded from host computer 116 to the measurement electronics board. Once the BOOTTSK has completed initialization, it sleeps and allows a Command Process Task (CMDPROCTSK), indicated by reference numeral 814, to start running. The CMDPROCTSK waits at a read statement for incoming characters. When a valid address character is received, the code collects the remaining characters in the message, parses the message, verifies the checksum and then builds a response. The response data is taken from dynamic data table 804.

A Temperature Task (TEMPTSK), indicated by reference numeral 808, takes the raw analog EMF measurements from dynamic data table 804, and converts them into microvolt values. Then, the TEMPTSK computes temperature values for each thermocouple channel associated with the respective EMF measurements. TMPTSK uses a combination of resistance measurements, temperature measurements and diagnostic loop measurements to calculate the output temperature. Individual measurements that are determined to not match their initial calibration references within user defined limits are discarded from the calculations. The confidence level of the output temperature is also calculated. Once the TMPTSK has been completed, the final temperature result is updated and the 4–20 mA DAC output 728 is updated. The TMPTSK may use the Queued Synchronous Port Interface (QSPI) resource of processor 415 to write data to DAC 417. ADCTSK also may use the QSPI resource to communicate with ADC 414.

Health Task (HEALTHTSK), indicated by reference numeral 810, runs at periodic intervals, e.g., every 2 seconds. This task calculates the resistance for the four resistance channels 717 on sensor 110. If required, the task measures the sheath resistance of sensor 110. HEALTHTSK next performs a series of confidence checks against limits provided by the user in the configuration downloaded from computer 116. These tests check for correct DC resistance and channel temperatures. Finally, processor 415 sums all the confidence errors relative to the user-defined limits and, using a weighting system, produces an overall system confidence reading as a percentage.

The confidence measurements are then recorded as inputs for host computer system 116 to read. In one embodiment, these limits can be expressed as colors. For example, red may represent out of range, i.e., a significant degradation problem, yellow may represent a low level degradation problem, and green may represent no significant effects from degradation and correct operation. The overall confidence limit can be expressed in LEDs mounted on the measurement electronics board, as well as through inputs to host computer 116 for display on a monitor. The resistance measurement involves calculating the multiplexer, cable, and sensor resistance values. The cable impedance need only be calculated when a new sensor is installed. The sensor resistance measurement is compared to an impedance calculated from a table. The deviation in these numbers can be reported in the results.

The ADC Task (ADCTSK) 806 runs constantly to change the MUX 410 switches, and start the ADC conversions, and waits for an interrupt to indicate that a conversion is ready. The conversions are read into an array that is used to store the numbers for a sliding window average. A sliding window average is performed on each sensor channel. The result then is stored in a count location for the channel being measured. The task collects thermocouple EMF readings normally, but may collect resistance EMF readings on a less frequent basis, e.g., every half-second. When the ADCTSK performs a system calibration, it executes the following actions: (1) reset the ADC 414; (2) perform a calibration by first setting a span voltage from a voltage reference, e.g., 100 mV and then a zero value; the voltages are set by the MUX 410 and measured through the amplifier/filter 412, which may have a gain on the order of 25; (3) recalculate the sensor and multiplexor resistances. The cable impedance need only be recalculated after a reconfiguration which ordinarily is done only after installation of a new sensor 110.

A Temperature Cold Junction Compensation Task (TCJCTSK), indicated by reference numeral 816, measures the cold junction on the measurement electronics board. The task runs, e.g., every 5 seconds, and measures the temperature to within 0.01 of a degree C. The TCJCTSK task compares the measured temperature to the last value measured. If the difference exceeds the +−0.02 degree limit, TCJCTSK sets the Calibration event. This causes ADCTSK to perform a calibration of ADC 414.

A Flash Memory Task (FLASHTSK), indicated by reference numeral 818, waits at a mailbox for another task in the system to send it data indicating what part of FLASH memory 710 is to be written, and with what data from RAM memory 712. This function can be run as a separate task to allow the communication tasks to run and still respond to the host computer 116 system with a device busy message. Depending on the size of the configuration table, FLASHTSK can take an extended period of time to complete the flash writing process. The ADCTSK and the BOOTTSK processes both use the same mailbox. The ADCTSK uses the mailbox to write a new cable resistance value after a sensor 110 has been changed.

The Idle Task (IDLETSK), indicated by reference numeral 820, runs, e.g., every half-second. IDLETSK writes to a watch dog timer register in processor 415 and toggles a "heart beat" LED on the measurement electronics board. The watch dog timer can be set to trip after 8 seconds. This task is used to prevent the system from hanging in an endless loop.

Although the present invention and its advantages have been described in detail, it should be understood that various changes, substitutions and alterations can be made herein without departing from the spirit and scope of the invention as defined by the appended claims.

What is claimed is:

1. A device for evaluating the condition of a thermocouple, the device comprising:
   a thermocouple having first and second thermoelements, each of the thermoelements being electrically coupled to a junction point and to a measuring circuit;
   a third electrically conductive element electrically coupled to the junction point, and to the measurement circuit wherein the thermoelements the third electrically conductive element circuit and the measuring circuit define a plurality of measurement loops; and
   the measuring circuit measures the resistance in one or more of the measurement loops.

2. The device of claim 1, wherein the measuring circuit includes a processor, the processor measuring and permanently recording an initial operating condition loop resistance and comparing the initial operating condition loop resistance to subsequent loop resistances taken over time as the thermoelements age to detect degradation of the thermoelements.

3. The device of claim 2, wherein the processor forms a calibration reference from the initial operating condition loop resistance and the subsequently measured loop resistances are compared to the calibration reference to detect degradation of the thermoelements.

4. The device of claim 1, wherein the diagnostic element and the first thermoelement form a first measurement loop.

5. The device of claim 1, wherein the third electrically conductive element and the first thermoelement form a first measurement loop, the third electrically conductive element and the second thermoelement form a second measurement loop, and the first and second thermoelements form a thermocouple loop.

6. The device of claim 5, further comprising a fourth electrically conductive element coupled to the junction point, wherein the fourth electrically conductive element and the second thermoelement form a second measurement loop.

7. A system for detecting degradation of a temperature measurement circuit having first and second thermoelements forming a thermocouple coupled at the thermocouple junction and to the measurement circuit, the system comprising:
   a third electrically conductive element coupled to the thermocouple junction and to the measurement circuit, the first thermoelement, the third electrically conductive element and the measurement circuit defining a first measurement loop and the second thermoelement, the third electrically conductive element and the measurement circuit defining a second measurement loop;
   the measurement circuit measuring a resistance of the first and second measurement loops; and
   a processor programmed to:
     store an initial loop resistance for each of the first and second measurement loops as a reference;
     compare a subsequently measured loop resistance to the reference; and
     generate a signal indicative of degradation in the event the difference between the measured loop resistances and the reference exceeds a threshold.

8. The system of claim 7, wherein the first and second thermoelements and the third electrically conductive element define a first degradation check loop and a second degradation check loop.

9. A system for detecting degradation of a temperature measuring circuit having first and second thermocouples each comprised of first and second thermoelements coupled at a junction, on one end and to a measurement electronics on the other end, comprising:

a fifth thermoelement coupled at the junction with the first and second thermocouples on one end and the measurement electronics on the other end, said fifth thermoelement and said first thermoelement of said first thermocouple defining a first measurement loop, said fifth thermoelement and said second thermoelement of said first thermocouple defining a second measurement loop, said fifth thermoelement wire and said first thermoelement wire of said second thermocouple defining a third measurement loop, and said fifth thermoelement of said second thermoelement of said second thermocouple defining a fourth measurement loop;

the measurement electronics circuit periodically measuring the resistance of the first, second, third and fourth measurement loops; and a processor programmed to:
store an initial loop resistance for the first, second, third, and fourth measurement loops as a reference;
compare subsequently measured loop resistances to the references; and
generate a signal indicative of degradation in the event the difference between the measured loop resistance and the reference exceeds a threshold.

10. A method for monitoring the condition of a thermocouple having first and second thermoelements forming a thermocouple junction, the method comprising:

defining a first measurement loop, said first measurement loop being formed by a third electrically conductive element coupled to the thermocouple junction and a first thermoelement bridge circuit and the first thermoelement coupled to the thermocouple junction and the first thermoelement bridge circuit;

defining a second measurement loop, said second measurement loop being formed by the third electrically conductive element coupled to the thermocouple junction and a second thermoelement bridge circuit and the second thermoelement coupled to the thermocouple junction and the first thermocouple bridge circuit;

recording an initial loop resistance in at least one of the first or second measurement loops;

thereafter, recording a subsequent loop resistance in the at least one of the first or second measurement loops; and comparing the initial loop resistance to the subsequent loop resistance to determine if degradation of the thermoelement leg in at least one of the first or second measurement loops has occurred.

11. A method for monitoring the condition of a thermoelement in a thermocouple using an electrically conductive element connected to a common junction point with the thermoelement, wherein the diagnostic element and the thermoelement are also connected to measurement electronics and thereby define a loop, the method comprising:

measuring the initial loop resistance under an initial operating condition;

measuring a first subsequent loop resistance under a subsequent operating condition; and comparing the initial loop resistance to the first loop resistance to determine the change in resistance of the thermoelement.

12. The method of claim 11, further comprising measuring a second subsequent loop resistance under a second subsequent operating condition after the first subsequent loop resistance.

13. The method of claim 11, further comprising measuring a plurality of subsequent loop resistances under a plurality of subsequent operating conditions as the thermocouple ages and comparing the plurality of subsequent loop resistances to the initial loop resistance.

14. The method of claim 11, further comprising determining a degradation level of the thermoelement by comparing the initial loop resistance to the subsequent loop resistance.

15. A method of monitoring the thermoelements in a temperature sensor while the sensor is in operation using a measurement circuit connected to the thermoelements and one or more diagnostic elements connected at a junction with the thermoelements, and connected to the measurement circuit the method comprising:

measuring an initial loop resistance for one or more loops formed by the combination of the thermoelements and one or more of the diagnostic elements and the measurement circuit under an initial operating condition;

measuring a first subsequent loop resistance for one or more of the loops formed by the combination of the thermoelements and the one or more diagnostic elements and the measurement circuit under a subsequent operating condition; and comparing the initial loop resistance for each of the measured loops to the first subsequent loop resistance for each of the measured loops to determine the change in resistance of the thermoelements in the measured loops.

16. The method of claim 15, further comprising measuring an initial loop resistance for each of the measured loops under an initial operating condition.

17. The method of claim 15, further comprising measuring a first subsequent loop resistance for each of the measured loops under a subsequent operating condition.

18. A device for monitoring the condition of a thermocouple housed in an electrically conductive sheath, the device comprising:

a thermocouple having first and second thermoelements, each of the thermoelements being electrically coupled at a junction point and to measurement means;

a diagnostic element electrically coupled to the junction point, and to the measurement means wherein the thermoelements and the diagnostic element and the measurement means define a plurality of measurement loops;

an electrically conductive element electrically coupled to the conductive sheath, wherein the electrically conductive element and the diagnostic element form a measuring circuit; and the measurement means that measure the resistance of one or more of the measurement loops and in the measurement circuit.

19. The device of claim 18, wherein the measurement means includes a processor, the processor measuring the resistance of the measuring circuit and comparing the measured resistance to a predetermined reference.

20. The device of claim 19, wherein the processor generates a signal indicative of a virtual junction error when the measured resistance is less than the predetermined reference.

21. The device of claim 18, wherein the electrically conductive element contains a resistor.

22. The device of claim 18, wherein the electrically conductive element contains a diode.

23. A method for monitoring the condition of a thermocouple housed in an electrically conductive sheath, the method comprising:

measuring the resistance across a measuring circuit, the measuring circuit comprising the conductive sheath, a conductive element, and a thermoelement or a diagnostic element;

comparing the measured resistance to a predetermined reference; and outputting a signal indicative of a virtual junction error in the event the measured resistance is less than the predetermined reference.

24. The system of claim 7 wherein the third electrically conductive element comprises a nichrome alloy element.

* * * * *